United States Patent [19]

Keller et al.

[11] 3,752,579

[45] Aug. 14, 1973

[54] LIGHT EXPOSURE APPARATUS AND METHOD

[75] Inventors: Charles Herman Keller; Patrick Oliver Wilson, both of Sunnyvale, Calif.

[73] Assignee: Pek, Inc., Sunnyvale, Calif.

[22] Filed: June 14, 1971

[21] Appl. No.: 152,510

[52] U.S. Cl. .................... 355/97, 240/20, 240/41.1, 355/99, 355/132, 355/133

[51] Int. Cl. .................... G03b 27/04

[58] Field of Search .................... 355/78, 84, 97, 99, 355/100–103, 113, 119, 132, 133; 240/1.3, 20, 41.1, 41.35, 46.01, 46.45, 46.47, 46.49, 46.55

[56] References Cited

UNITED STATES PATENTS

| | | | |
|---|---|---|---|
| 3,211,072 | 10/1965 | Jonker | 355/79 |
| 3,204,544 | 9/1965 | Shannon | 355/133 |
| 2,408,310 | 9/1946 | Hassler | 355/103 |
| 3,202,070 | 8/1965 | Pratt et al. | 355/100 |
| 3,503,681 | 3/1970 | Jons et al. | 355/78 |
| 3,524,052 | 8/1970 | Troue | 240/46.1 X |
| 2,327,818 | 8/1943 | Peterson | 240/46.55 |
| 3,270,194 | 8/1966 | Lee | 240/20 |

*Primary Examiner*—Richard L. Moses
*Attorney*—Limbach, Limbach & Sutton

[57] ABSTRACT

A light exposure apparatus and method is provided herein wherein a workpiece to be exposed is transported through an area illuminated by collimated light. The collimated light is provided by a point source of high intensity light and a parabolic reflector.

14 Claims, 6 Drawing Figures

LIGHT EXPOSURE APPARATUS AND METHOD

BACKGROUND OF THE INVENTION

This invention relates to apparatus and a method for exposing a workpiece to a collimated source of radiation such as light.

Exposure to radiation such as light of photosensitive materials has become a frequently required processing step in many areas of technology. These areas include the processing of printed circuit boards, silkscreens, hybrid substrates, semi-conductors and wafers, lithographic plates, chemical milling or any process where an image on a mask (commonly referred to as "art work") is to be transposed onto a photosensitive area. Often accurate reproduction is essential.

One specific example of an industrial application using photo-printing techniques is in semiconductor fabrication. A number of steps in semiconductor processing such as lead frame fabrication use photo-printing techniques. In this application, which is typical of other industrial applications using photoprinting, there are generally four basic steps required:

1. First, one applies a photosensitive emulsion, often called a "photoresist" material, to the surface of the entire workpiece.
2. Then a mask or pattern (the art work) either a positive or negative, is placed over the coated workpiece once the photosensitive emulsion is dried.
3. Next, the workpiece is exposed to light or other form of radiation.
4. Finally, the unexposed portion is etched away by chemicals which are ineffective to etch the exposed portions, thereby leaving a relief substantially identical with the pattern of the mask. In some cases the exposed areas are etched away.

The nature of the workpiece, of course, depends upon the particular application involved. In the case of lead frame construction for semiconductor devices, for example, the material upon which the photoresist is placed is often Kovar. In the case of integrated circuit fabrication, the workpiece typically comprises a silicon wafer. Other workpiece materials include metals or plastics.

The light exposure apparatus used in step (3) described above typically comprises a high intensity lamp mounted within a reflector for directing illumination upon a stationary workpiece. In prior art light exposure devices of this type, no attempt has been made to collimate the light issuing from the reflector and lamp combination. By collimated light, it is meant that the rays of light are essentially parallel with one another. The consequence of having non-collimated light is that it is necessary to maintain the mask in a very close intimate contact with the workpiece. If the workpiece is not in close contact with the mask the exposure near the edge of the mask results in "fuzziness" or "growing" as a result of the non-parallel light striking unevenly near the edges of the mask.

Various devices have been constructed to maintain the mask and the workpiece in such a close intimate relationship. For example, one common technique is to place the masked workpiece in a vacuum frame. The vacuum frame is evacuated thereby causing the transparent face of the frame to collapse and tightly compress the mask against the workpiece. The workpiece and mask is then held stationary while an exposure of the proper duration is made.

There are several deficiencies with this technique. First, no matter how intimate the contact between the mask and the workpiece, it is impossible to completely eliminate the fuzziness inherent with non-collimated light.

A second deficiency is that in some processing techniques the workpiece is of such a nature that the close intimate contact with the mask results in damage to the mask requiring frequent replacement thereto. Frequently having to replace a mask is both a time consuming and an expensive operation.

Another deficiency with the above prior art devices is that the exposure is made while the workpiece and mask are held in a stationary position. This means that if there is an imperfection or defect in the lamp, the reflector, etc., the point on the workpiece which is exposed thereto will not receive the proper amount of light. This can cause reduced yield and inferior and less uniform products.

Finally, it is both a time consuming and burdensome problem to have to take the workpiece and mask and insert these within a vacuum frame or contact plate. Typically this requires an operator who must insert the workpiece within the vacuum frame or contact plate, expose the mask and workpiece to the exposure light and finally to remove the mask and workpiece from the vacuum frame after the exposure.

SUMMARY OF THE INVENTION

In accordance with the invention a photo-printing system and method is provided wherein a masked workpiece is transported across an area illuminated by a collimated source of light. More particularly, the collimated source of light comprises a light source or lamp arranged adjacent to a parabolic reflector. In order to eliminate non-collimated rays of light which result from rays emanating from the lamp which are projected directly onto the workpiece rather than being reflected from the parabolic reflector, means are provided to absorb or re-reflect these non-collimated rays so that they do not strike the workpiece.

A requirement in many applications is that any given point on the surface of the workpiece be illuminated by the same amount of light, within prescribed tolerances. When transporting a workpiece under the reflector assembly described above, the amount of light exposure at any given point on the workpiece is a function of two parameters:

1. The amount of time that the workpiece is exposed to the light (i.e., the amount of time that it is within the illuminated area) and
2. The intensity of the light through which each point in the workpiece travels.

The intensity of the area illuminated by the combination of the lamp and reflector is normally non-uniform. This occurs for several reasons. First, the combination of the lamp itself and the means for eliminating the non-collimated, direct rays of light, result in a dark core area directly below the lamp. Secondly, the intensity of the collimated rays from the parabolic reflectors inherently diminishes the farther from the axis of the parabolic reflector. Third, the intensity of a typical lamp used in such a photo-printing device is non-uniform.

In accordance with the invention, the light emitted from the lamp and reflector combination is selectively blocked to cast a shadow in the area of illumination.

The amount and the shape of the shading is selected so that a workpiece moving under the illuminated area will be exposed, at each point thereon, to an equal amount of light, within prescribed tolerances at each and every point on the workpiece.

As explained above in determining the shape and size of the shaded area, the factors listed above must be taken into consideration. Well known mathematical or graphical techniques can be used to determine the exact size and configuration of the shaded area based upon these factors. Alternately the size and shape can empirically be determined.

The means used to shade the illuminated area can be a separate entity from the means used to block the non-collimated, direct rays from the lamp or both can be combined into a single light blocking device which provides both functions, i.e., to block the direct, non-collimated rays of light from the lamp from the workpiece and also to provide the necessary shaded area to provide uniform exposure.

In accordance with another aspect of the present invention, secondary reflecting/absorbing elements can be provided in the vicinity of the lamp to selectively reflect and/or absorb the rays from the light source so that the collimated rays of light emitted from the parabolic reflector are more uniform in intensity than would otherwise be the case. Such a secondary reflecting element might be desired in precision photo-printing applications.

By transporting the workpiece under the exposing light source a distinct advantage of over stationary exposure techniques is realized. The advantage is that any imperfections in the apparatus, such as in the reflector or light source intensity are averaged out as the workpiece passes beneath the exposure of light source. In contrast, in the case of a stationary exposure system, it is obvious that such imperfections will cause selected areas of the workpiece to be illuminated by a different degree of intensity than at other points. This results in lowered uniformity of results and can lead to poor fabricated products.

A most important feature of the invention is that the use of collimated light source for exposure eliminates the requirement that the mask be in close intimate contact with the workpiece being exposed. This means that vacuum frames and pressure plates are not required to maintain the intimacy between the mask and workpiece. As an additional benefit of this feature the life time of masks are significantly increased since there is no reason for the mask to be damaged by the contact by the workpiece itself.

Another feature of the invention is that the overall quality of the exposure is greatly enhanced by the use of collimated light. Thus, the "fuzziness" or "growing" effect due to diffused and non-collimated light is eliminated. This is true whether the mask is placed on the workpiece or is actually elevated from the workpiece during the exposure.

These and other features and advantages will become more apparent upon a perusal of the following specification taken in conjunction with the accompanying drawings wherein similar characters of reference refer to similar structures in each of the several views.

DESCRIPTION OF THE PREFERRED EMBODIMENTS

Figure 1:
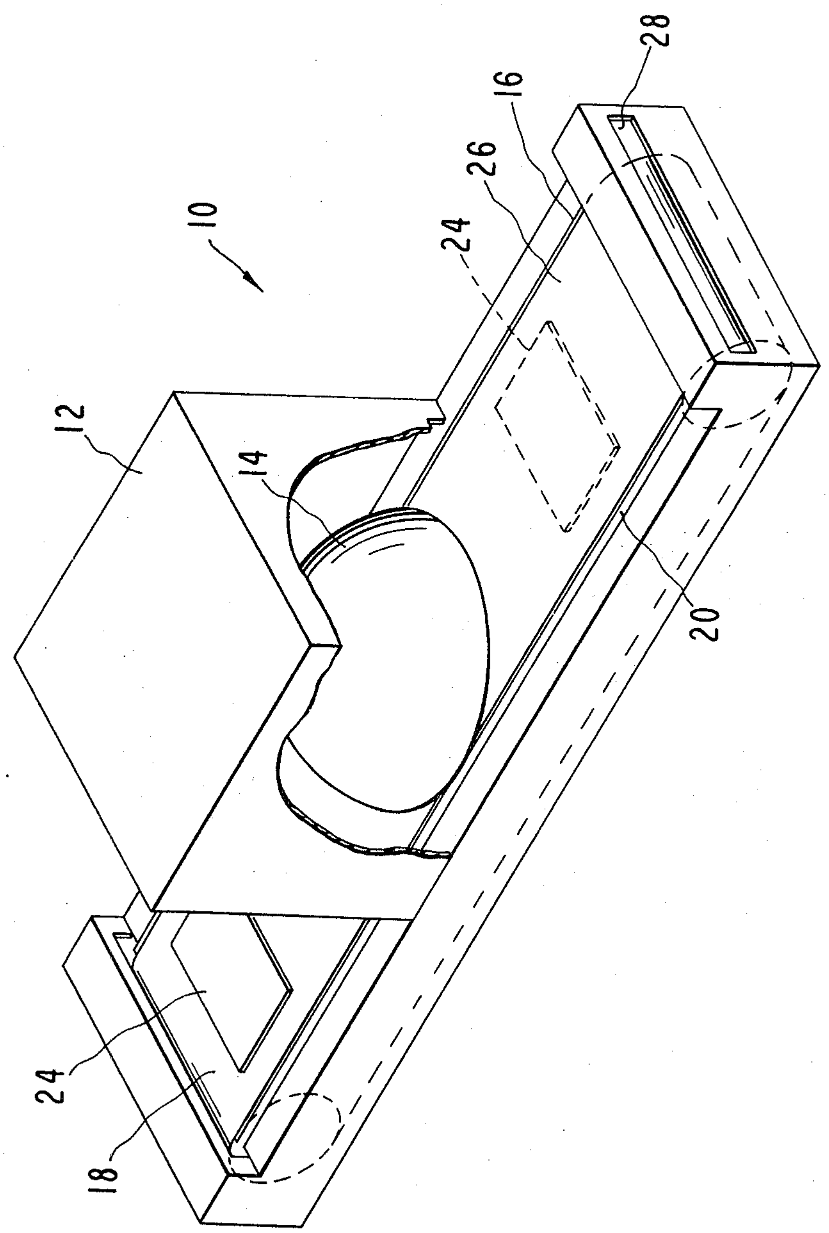
FIG. 1 is a perspective view, partially cut-away, of a photo-printing apparatus incorporating the collimated light exposure system of the present invention.

Illustrated in FIG. 1 is light exposure apparatus 10 in accordance with the present invention. Light exposure apparatus 10 includes a light exposure housing 12 including a collimated light source 14 (illustrated in more detail in FIG. 2) and a workpiece 24, and a transport assembly 16. A workpiece(s) 24 to be exposed is placed on the loading end 18 of the transport assembly 16, prior to exposure. Placed over the workpiece 24 is a mask 19 (FIG. 2A) which is desired to be reproduced on the workpiece. As explained previously, the mask need not be in close intimate contact with the workpiece. In fact, it can be totally out of contact with the workpiece. The transport assembly can, for example, comprise a continuous belt ocnveyor 20 driven by an appropriate drive motor system (not shown).

The workpiece(s) 24 is then transported to within and through the exposure housing 12 where it passes under the illuminated area provided by the collimated light source 14 in a manner which will be described in more detail subsequently. After passing through the exposure housing 12, the workpiece 24 arrives at the unloaded area 26 of the transport assembly. Here the exposed workpiece is unloaded for subsequent processing steps.

In the embodiment shown the transport assembly is provided with an opening 28 through which the exposed workpiece(s) 24 can pass. At this point, the exposed workpiece(s) may be fed onto a moving belt to be transported to other areas for processing. The latter is advantageous in an automatic processing system.

Figures 2A, 3, 4:
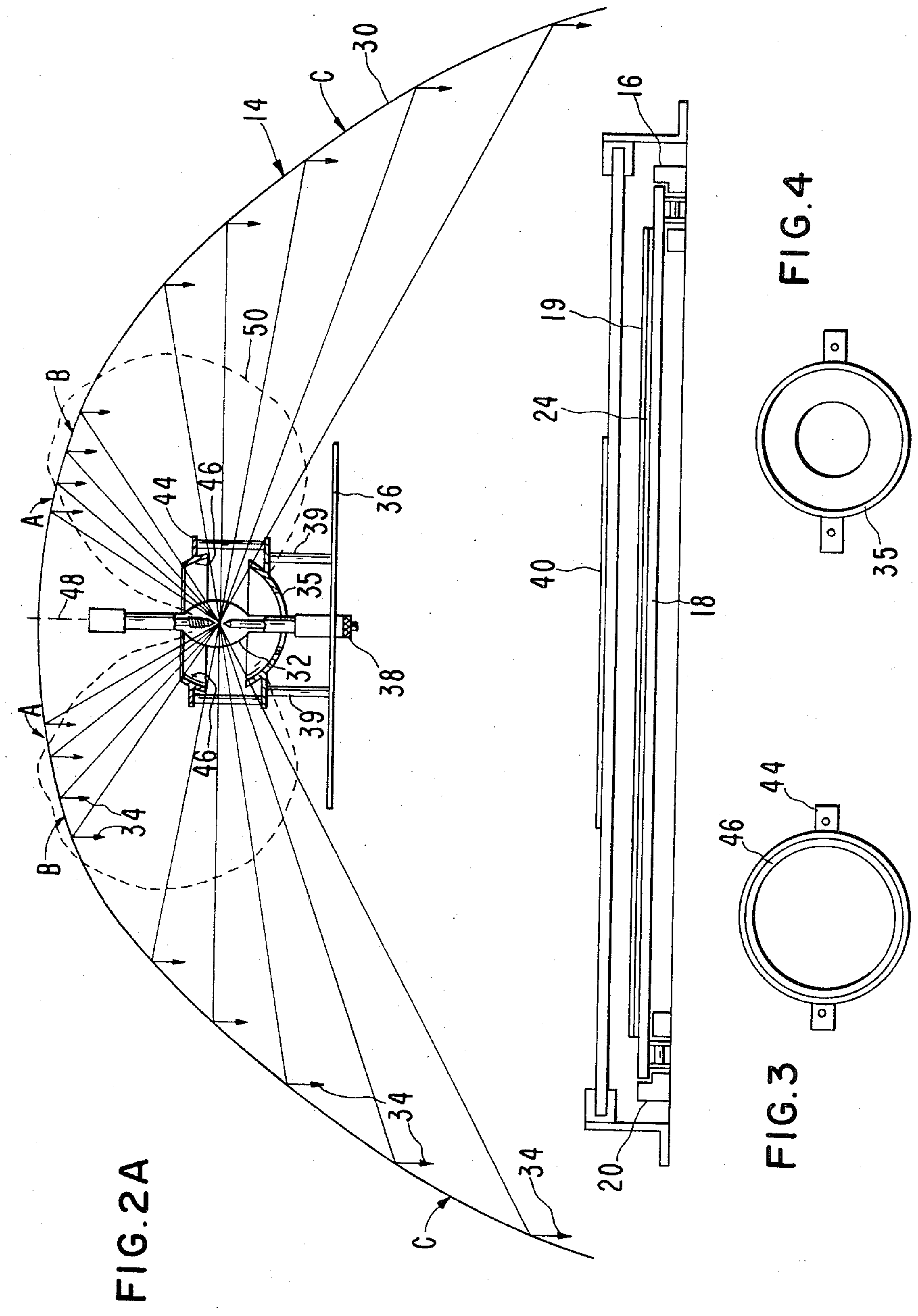
FIG. 2A is a detailed view in section of a collimated light exposure source comprising a parabolic reflector and a high intensity light source.
FIGS. 3, 4, and 5 are detailed views of various elements illustrated in FIG. 2A.

Details of the collimated light source 14 are shown in FIG. 2A. Collimated light source includes a parabolic reflector 30 and a high intensity lamp 32. The combination of the light source 32 and the parabolic reflector provides collimated, where the light source 32 is positioned at the focal point of the parabolic reflector 30, rays of light 34. The degree of collimation is governed by the following relationship:

$$\theta = 2 \tan r/f \qquad (1)$$

where $\theta$ = the degree of non-parallelism between any two rays
$r$ = the raduis of the effective size of the light source
$f$ = the focal length of the reflector.

A suitable lamp for photo-printing applications is a mercury short arc lamp such as the Illumination Industries, Inc. Model 350 or Model 500-2. In practical applications, one can except a value of $r$ of 0.090 in. With the use of a three-inch focal length parabolic reflector, this means that the divergence $\theta$ between any two light rays will be 3° 28 minutes. It has been found that in the embodiment illustrated the parabolic reflector should have a focal length which is approximately 0.22 times the desired width of the workpiece.

To block off the rays from lamp 32 which would otherwise fall directly on the workpiece 24 a light block is provided comprising plate 36 and a dome or spherical member 35. Plate 36 is suitably mounted, for example, by means of a screw and nut 38 to the base of the lamp 32. Member 35 is mounted to plate 36 by support columns 39. As pointed out above, the light block prevents the non-collimated rays of light from being projected onto the workpiece 24.

A shading plate 40 is suitably mounted within the light exposure assembly 12 to project the required shadow on the workpiece so that the workpiece transported within the illuminated area is equally illuminated at all points thereon.

Figure 2B:
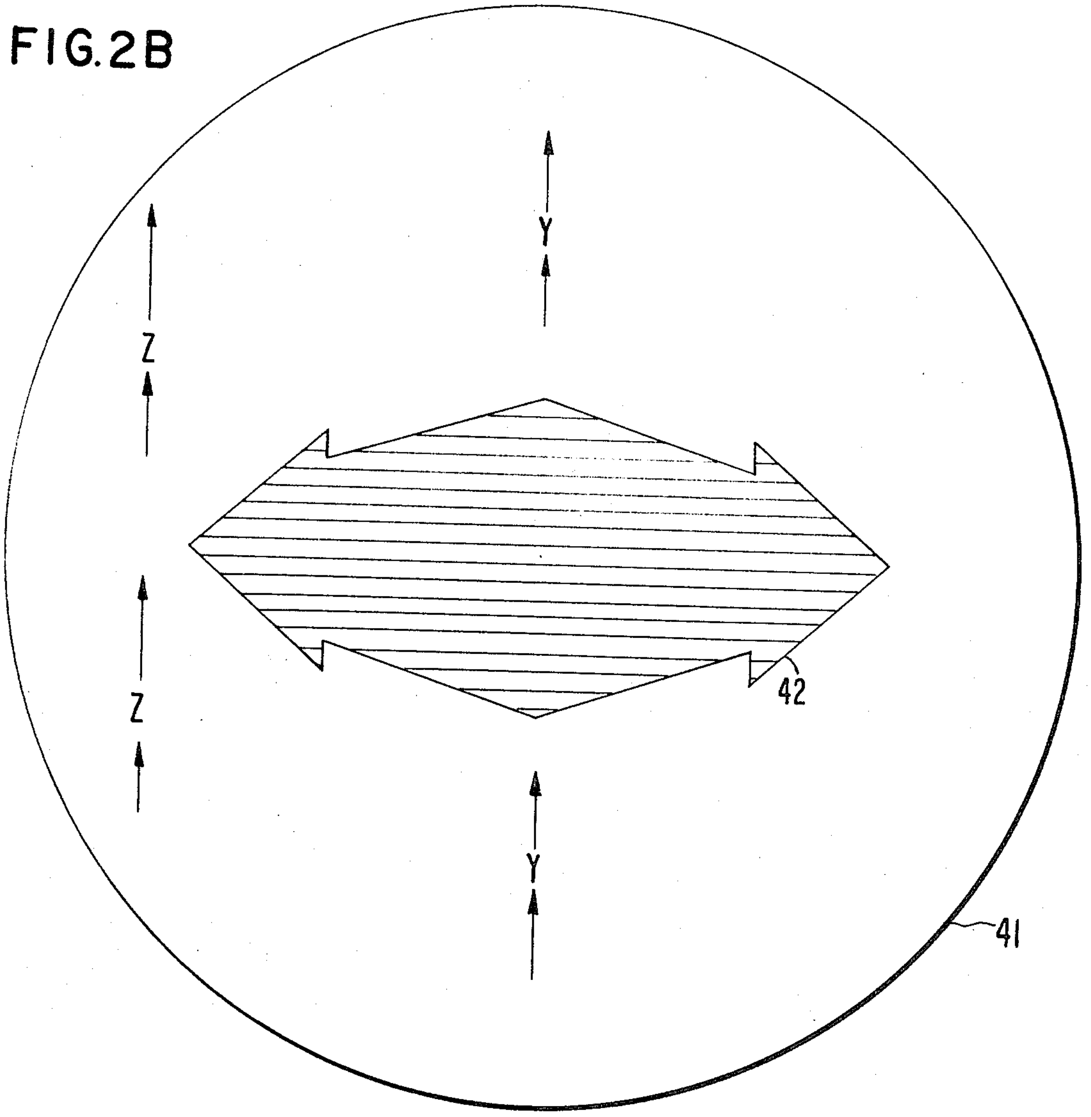
FIG. 2B illustrates the light pattern projected by the collimated light source in FIG. 2A.

The shape of the shader element 40, in the example illustrated, provides the shaded portion 42 shown in FIG. 2B. The overall area illuminated in FIG. 2B is within the area enclosed by the circle 41. Each workpiece 24 traveling across and within the illuminated area 41, with the shaded area 42 provided, will be illuminated to within about 3–10 percent at all points on the workpiece. For example, a point on the workpiece passing along path Z will be exposed, within this range of predetermined tolerances, to the same amount of light as a point along path Y.

Referring again to FIG. 2A, a light unifying element 44 can be provided to reduce differences in illumination intensity levels within the illumination area 41 of FIG. 2B. In the embodiment illustrated in FIG. 2A, the unifying element 44 includes reflecting portions 46 which reflect the light emitted from the lamp 32 to parts of the parabolic reflector 30 which would otherwise provide less intense light than in other portions.

The variation in intensity is a function both of the inherent properties of the parabolic reflector 30 and the variation in intensity of the lamp 32 at any given point. Thus with respect to the former, near the axis 48 of the parabolic reflector 30, the intensity projected from the reflector is greatest. This is represented in FIG. 2A by the space between the rays of light 34. For purposes of illustration this spacing assumes a uniform intensity lamp. In practice, of course, this does not occur.

Near the axis 48 the rays of light 34 are close together indicating that the light intensity is high. Farther away from the axis the rays are spaced farther apart indicating that the rays are less intense.

But as previously stated the intensity of the emitted light is also a function of the intensity of the light emitted from the lamp 32. A vertical intensity distribution is illustrated by the dotted line 50 for the Illumination Industries, Inc. 350 watt mercury arc lamp. The vertical intensity distribution 50 indicates the relative intensity of the rays emitted in any vertical plane.

Note that in directions near the axis of the parabolic reflector, the relative intensity of the lamp is low. But since the inherent intensity of light projected from the reflector 30 in this area, designated A, is high, the two tend to balance out each other. However, in the area illustrated at B, the intensity of the lamp is high and the concentration of the rays reflected by the parabolic reflector 30 is great. Hence for this area, light unifying element 44 reflects the rays from the lamp 32 to the area designated by C where both the intensity from the parabolic reflector 30 is low and the relative intensity from the lamp 32 is low.

A bottom view of the unifying element 44 is shown in FIG. 3. Note that in the embodiment illustrated the element 46 comprises only reflective portions. It is to be understood, however, that even more uniform results are possible by additionally providihg absorbing areas or transparent areas, or any combination of these three as required in order to more uniformly distribute the light within the illumination area 41.

A top view of the domed shaped element 35 is shown in FIG. 4. The blocking element 35 can also be made selectively reflective, transmissive, or absorbing, or a combination of the three, in order to provide, along with plate 36, a more uniform illumination intensity upon the workpiece.

As explained, the blocking plate 36 is used to complete the blocking provided by element 35 and yet allow cooling conduction currents to the lamp. This plate and element 35 can be combined with the shader plate 40 to provide a single integral shade which provides both functions, i.e., to block the direct, non-collimated rays to the workpiece and provide the proper shading pattern in the illumination area.

Figure 5:
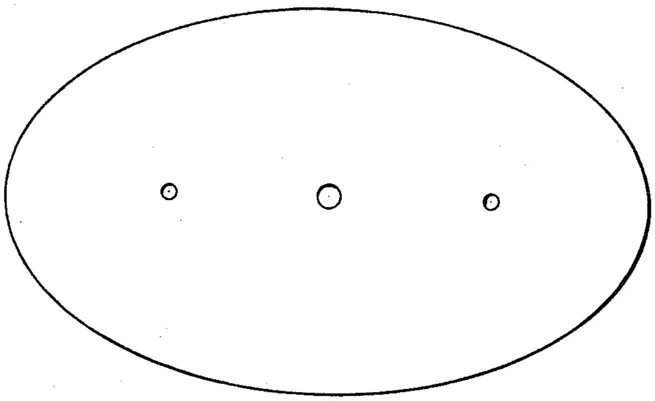

FIG. 5 shows a top view of the element 36 which would be required in order to replace the shader 40 to provide a range of about 5–10 percent deviation in uniformity.

The shader 40, in addition to the function of providing the shaded portion 42 in the illumination area 41, can also be used to aid in optimizing uniformity of light intensity and with sufficient sophistication in design can, along with unifying element 44, provide substantially zero variation in intensity across the workpiece. This element can also be used to block or selectively pass varying wavelengths of light. In normal applications it could be IR reflecting (above 7000 A) and highly UV transmissive in the areas that are unshaded.

It has been found that the reflector should be cut to a diameter of approximately 1.5 times the desired workpiece width.

The size and configuration of the shaded area 42 in FIG. 2A has been arrived at in order to provide within ± 3 percent light intensity uniformity for the particular lamp 32 described and for a parabolic mirror having a 3 inch focal length reflector and a 20 inch diameter. It should be understood that for different intensity tolerances and/or for different lamps and reflectors, the shape and size of the shadow 42 will vary.

The shadow cast by the plate 40 need not be solid. Thus, for example, the plate 40 could consist of a series of opaque strips or perforations.

What is claimed is:

1. Light exposure apparatus for exposing a workpiece comprising:

a. a parabolic reflector;

b. a lamp arranged adjacent to said reflector to provide collimated light rays directed to said workpiece;

c. means for transporting said workpiece through at least part of the area illuminated by said collimated light rays;

d. means for preventing non-collimated rays of light from said lamp from striking the workpiece directly from said lamp; and e. means for blocking out a predetermined portion of the area illuminated by said collimated light rays so that each point on said workpiece is illuminated equally within predetermined tolerances as said workpiece is transported thereacross.

2. Light exposure apparatus as in claim 1 wherein said preventing means and said blocking means are combined in a single structure.

3. Light exposure apparatus as in claim 2 wherein said lamp is characterized as having a non-uniform intensity output therefrom and wherein said light exposure apparatus additionally includes means for redistributing the light from said lamp to provide a more uniform light energy distribution within said illuminated area.

4. Light exposure apparatus as in claim 2 wherein said lamp is characterized as having a non-uniform intensity output therefrom and wherein said light exposure apparatus additionally includes means for selectively reflecting light rays emitted from said lamp for providing a more uniform light intensity distribution from said parabolic reflector.

5. Light exposure apparatus as in claim 4 wherein said selective reflective means additionally includes means for selectively absorbing light from said lamp.

6. Light exposure apparatus as in claim 4 including a mask located on said workpiece to selectively expose said workpiece.

7. Light exposure apparatus as in claim 6 wherein said mask is in non-intimate contact with said workpiece.

8. In a fabrication process characterized by exposing a workpiece to light or other radiation source, and wherein only selected surface areas of the workpiece are exposed by means of masks for blocking the light to the non-selected areas of the workpiece, wherein the improvement comprises:

placing said mask in an adjacent position relative to said workpiece, said mask being solely maintained in position by gravity action;

placing a high intensity light source adjacent to a parabolic reflector;

blocking out non-collimated non-reflected light rays emanating directly from the light source to provide a collimated light generator;

blocking out selected portions of the light from said collimated light generator by means of a shading element so that a masked workpiece exposed to and transported through the collimated light receives the same amount of light energy at each point thereon within predetermined tolerances; and transporting said workpiece across said modified illuminated area to expose said masked workpiece.

9. The method of claim 8 including the step of redistributing the light from said lamp to provide a more uniform light energy distribution within said illuminated area.

10. A method of exposing a workpiece to a light exposure source comprising:

illuminating an area with collimated light from the combination of a lamp and a parabolic reflector;

blocking out selected portions of said area so that a workpiece transported thereacross will receive the same amount of light energy at each point thereon within predetermined tolerances; and transporting said workpiece across said modified illuminated area to expose the workpiece.

11. A method as in claim 10 including the step of redistributing the light from said lamp to provide a more uniform light energy distribution within said illuminated area.

12. A method as in claim 10 including the step of masking the workpiece prior to exposing the same.

13. A method as in claim 10 including the step of placing a mask in non-intimate contact with said workpiece before exposing the same.

14. In a fabrication process characterized by exposing a workpiece to light or other radiation source, and wherein only selected surface areas of the workpiece are exposed by means of masks for blocking the light to the non-selected areas of the workpiece, wherein the improvement comprises:

placing said mask in a spaced-apart position relative to said workpiece;

placing a high intensity light source adjacent to a parabolic reflector;

blocking out non-collimated non-reflected light rays emanating directly from the light source to provide a collimated light generator;

blocking out selected portions of the light from said collimated light generator by means of a shading element so that a masked workpiece exposed to and transported through the collimated light receives the same amount of light energy at each point thereon within predetermined tolerances; and transporting said workpiece across said modified illuminated area to expose said masked workpiece.

* * * * *

UNITED STATES PATENT OFFICE
CERTIFICATE OF CORRECTION

Patent No. 3,752,579 Dated August 14, 1973

Inventor(s) Charles Herman Keller et al.

It is certified that error appears in the above-identified patent and that said Letters Patent are hereby corrected as shown below:

On the cover sheet item 73 Assignee should be changed from "Pek, Inc." to -- Illumination Industries, Inc. --.

Column 4, line 29, delete "ocnveyor" and insert -- conveyor --.

Column 4, line 50, after "collimated" insert -- rays of light 34 --.

Column 4, lines 50 and 51, cancel ", where the light source 32 is positioned at the focal point of the parabolic reflector 30," and insert -- , where the light source 32 is positioned at the focal point of the parabolic reflector 30, -- after "collimation", in line 52.

Column 4, line 60, delete "raduis" and insert -- radius --.

Column 6, line 7, delete "providihg" and insert -- providing --.

Signed and sealed this 19th day of March 1974.

(SEAL)
Attest:

EDWARD M.FLETCHER,JR.
Attesting Officer

C. MARSHALL DANN
Commissioner of Patents

FORM PO-1050 (10-69)
USCOMM-DC 60376-P69
☆ U.S. GOVERNMENT PRINTING OFFICE : 1969 O—366-334.